US010784245B2

(12) United States Patent
Jessen

(10) Patent No.: US 10,784,245 B2
(45) Date of Patent: *Sep. 22, 2020

(54) HIGHLY INTEGRATED RF POWER AND POWER CONVERSION BASED ON GA2O3 TECHNOLOGY

(71) Applicant: Government of the United States, as represented by the Secretary of the Air Force, Wright-Patterson AFB, OH (US)

(72) Inventor: Gregg H Jessen, Beavercreek, OH (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 16/435,666

(22) Filed: Jun. 10, 2019

(65) Prior Publication Data
US 2019/0296000 A1 Sep. 26, 2019

Related U.S. Application Data

(63) Continuation of application No. 15/922,432, filed on Mar. 15, 2018, now Pat. No. 10,461,068.
(Continued)

(51) Int. Cl.
*H01L 25/18* (2006.01)
*H01L 23/00* (2006.01)
(Continued)

(52) U.S. Cl.
CPC ............ *H01L 25/18* (2013.01); *H01L 23/147* (2013.01); *H01L 23/373* (2013.01);
(Continued)

(58) Field of Classification Search
CPC ..... H01L 25/18; H01L 23/147; H01L 23/373; H01L 23/3731; H01L 23/3732; H01L 24/17; H01L 24/13; H01L 24/16; H01L 2224/13139; H01L 2224/13144; H01L 2224/13147; H01L 2224/16145; H01L 2224/16227; H01L 2924/01029; H01L 2924/01079; H01L 2924/14215
(Continued)

(56) References Cited

U.S. PATENT DOCUMENTS

2008/0142813 A1* 6/2008 Chang ................. H01L 33/0079
257/77
2009/0017566 A1* 1/2009 Basin ................. H01L 33/0079
438/26

* cited by examiner

Primary Examiner — Didarul A Mazumder
(74) Attorney, Agent, or Firm — AFMCLO/JAZ; Charles Figer, Jr.

(57) ABSTRACT

An integrated circuit is provided including a first substrate with a first thermal conductivity. An active layer is deposited on the first substrate. At least one native device is fabricated on the active layer. A window is formed in the active layer, which exposes a portion of the first substrate. A non-native device is fabricated on a second substrate with a second thermal conductivity lower than the first thermal conductivity. The non-native device is flip-chip mounted in the widow on the first substrate and electrically connected to the at least one native device. The non-native device is also thermally connected to the first substrate such that heat generated by the non-native device is removed through the first substrate.

20 Claims, 10 Drawing Sheets

Related U.S. Application Data

(60) Provisional application No. 62/471,440, filed on Mar. 15, 2017.

(51) Int. Cl.
*H01L 23/14* (2006.01)
*H01L 23/373* (2006.01)

(52) U.S. Cl.
CPC ...... *H01L 23/3731* (2013.01); *H01L 23/3732* (2013.01); *H01L 24/17* (2013.01); *H01L 24/13* (2013.01); *H01L 24/16* (2013.01); *H01L 2224/13139* (2013.01); *H01L 2224/13144* (2013.01); *H01L 2224/13147* (2013.01); *H01L 2224/16145* (2013.01); *H01L 2224/16227* (2013.01); *H01L 2924/01029* (2013.01); *H01L 2924/01079* (2013.01); *H01L 2924/14215* (2013.01)

(58) Field of Classification Search
USPC ......... 257/499; 438/218, 219, 294, 353, 400
See application file for complete search history.

HIGHLY INTEGRATED RF POWER AND POWER CONVERSION BASED ON GA2O3 TECHNOLOGY

CROSS-REFERENCE TO RELATED APPLICATIONS

This application is a continuation of U.S. application Ser. No. 15/922,432, entitled "Highly Integrated RF Power and Power Conversion Based on $Ga_2O_3$ Technology," filed on Mar. 15, 2018, which claims the benefit of and priority to U.S. Provisional Application Ser. No. 62/471,440, entitled "Highly Integrated RF Power and Power Conversion Based on $Ga_2O_3$ Technology," filed on Mar. 15, 2017, the entireties of which is incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

This invention is related to semiconductor devices, and more particularly, to semiconductor devices that are flip-chip mounted onto the active layers of the devices for improved head dissipation.

Description of the Related Art

SiC and GaN power devices have attracted much attention as key components for high-efficiency power conversion. Their device performance can far exceed that of the Si-based devices mainly used in current power electronics. However, while performance of SiC and GaN based devices is good, they are not the only candidates for next-generation power devices. For example, Gallium oxide ($Ga_2O_3$) has gained increased attention for power devices due to its superior material properties and the availability of economical device-quality native substrates. The material possesses excellent properties such as a large band gap of 4.7-4.9 eV with an estimated high breakdown field of 8 MV/cm.

But, while $Ga_2O_3$ has shown promise for superior switching and high-efficiency power conversion performance, $Ga_2O_3$ also has poor thermal conductivity. Thus, achieving full performance of $Ga_2O_3$ is extremely challenging due to self-heating. This heating is generally confined close to the gate and back side thermal solutions are only partially effective due to the poor thermal conductivity of the material. Some contemporary solutions to this problem include attempting to pull heat out from both the front and backside of the chip by sandwiching the chip between metal.

Accordingly, there is a need in the art to better control heat in $Ga_2O_3$ based devices to be able to take advantage of their superior performance.

SUMMARY OF THE INVENTION

Embodiments of the invention provide a configuration for utilizing $Ga_2O_3$ technology while dissipating the heat generation. Embodiments of the invention do not mount $Ga_2O_3$ chips to heatsinks as is the contemporary convention. Rather, embodiments of the invention use a substrate of other active components as a heatsink to achieve a very high level of integration with low electrical parasitic losses.

Embodiments of the invention provide an integrated circuit including a first substrate with a first thermal conductivity. An active layer may then be deposited on the first substrate. At least one native device is fabricated on the active layer and a window is formed in the active layer exposing a portion of the first substrate. A non-native device is fabricated on a second substrate with a second thermal conductivity lower than the first thermal conductivity. The non-native device is flip-chip mounted in the widow on the first substrate and electrically connected to the native device. The non-native device is also thermally connected to the first substrate such that heat generated by the non-native device is removed through the first substrate.

In other embodiments, the substrate may also be the active layer. In these embodiments the integrated circuit may include the first substrate having a first thermal conductivity. At least one native device may then be fabricated on the first substrate. A first insulating region is formed on the first substrate via implantation. A non-native device is fabricated on a second substrate with a second thermal conductivity lower than the first thermal conductivity. The non-native device is flip-chip mounted to the first insulating region and electrically connected to the native device. The non-native device is also thermally connected to the first substrate such that heat generated by the non-native device is removed through the first substrate.

If the substrate is not acting as the active layer, then the integrated circuit may further include an active layer deposited on the first substrate, where the native device is fabricated on the active layer, and where the first insulating region is formed on the active layer via implantation. In this configuration, heat generated by the non-native device is removed through the active layer and the first substrate.

In still other embodiments, again the substrate may be the active layer and the insulating regions may electrically isolate a region of the active layer. In these embodiments, the integrated circuit includes a first substrate with a first thermal conductivity. At least one native device fabricated on the first substrate. A first insulating region may then be formed on the first substrate via implantation. The first insulation region electrically isolates a first isolated conduction region on the first substrate. A non-native device is fabricated on a second substrate with a second thermal conductivity lower than the first thermal conductivity. The non-native device is flip-chip mounted such that at least one electrode of the non-native device is electrically connected to the first isolated conducting region and the non-native device is further electrically connected to the at least one native device. The non-native device is also thermally connected to the first substrate such that heat generated by the non-native device is removed through the first substrate.

As with the previous embodiments, if the substrate is not the active layer, then the integrated circuit may further include an active layer deposited on the first substrate where the native device is fabricated on the active layer. For this configuration, the first insulating region is formed on the active layer via implantation forming the first isolated conducting region on the active layer. Heat generated by the non-native device is removed through the active layer and the first substrate. Some of these embodiments may include a second insulating region formed on the first substrate via implantation. For these embodiments, both the first and second insulating regions electrically isolate the first isolated conduction region on the first substrate.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention simultaneously solve thermal problems associated with materials such as $Ga_2O_3$ while allowing for point of use conversion integrated with configurations such as GaN on SiC for use in RF power electronics. For example, for electronically scanned array applications, off-chip intermediate power conversion steps can be removed and high voltage can be run to miniaturized power converters that are bonded directly to each GaN/SiC T/R MMIC. Running power at high voltage to each element allows low current to be used, which assists in reducing routing congestion and may dramatically shrink the entire array and system due to relaxed power delivery constraints.

Further, embodiments of the invention provide a method of integrating power conversion and high-performance RF in which a material with excellent power conversion metrics but with poor thermal conductivity may be thermally shunted to a substrate with high thermal conductivity. As an example, low to medium power buck converters may be fabricated on $Ga_2O_3$ materials and then flip chip bonded to GaN on SiC substrates with RF power MMICs. The heat generated at the $Ga_2O_3$ surface can then be removed via the SiC substrate.

Figure 1:
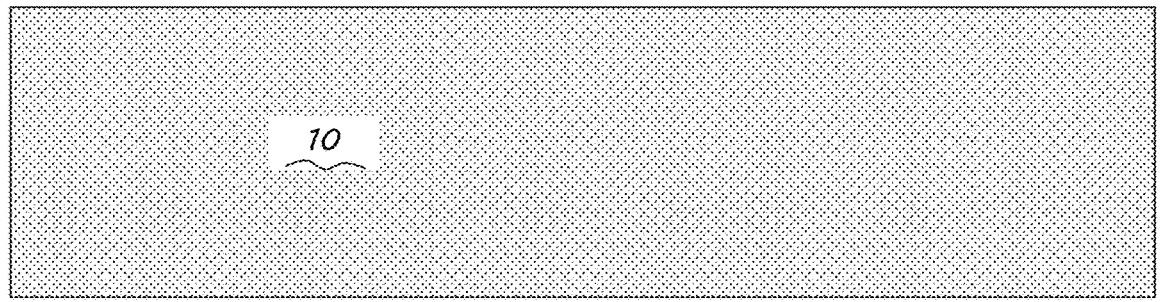
FIG. 1 is a representation of a substrate.
Figure 2:
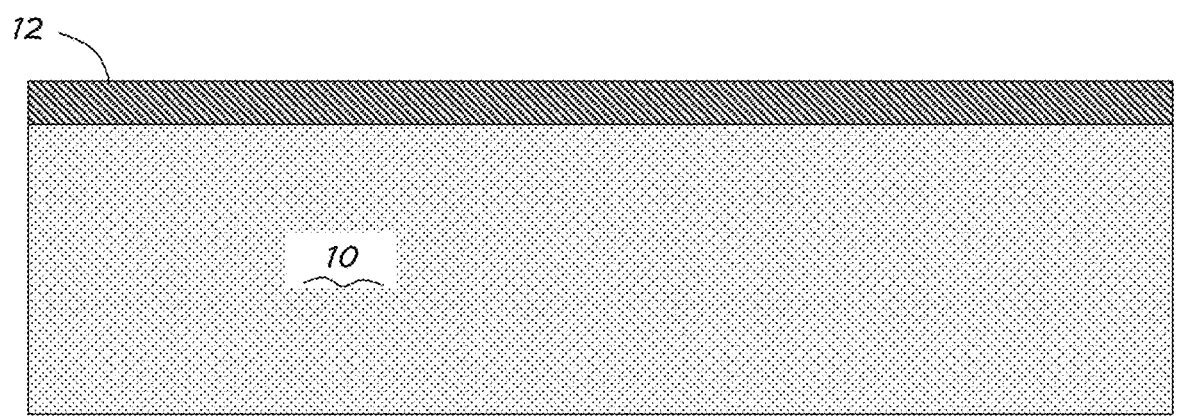
FIG. 2 is a representation of the substrate of FIG. 1 with an active layer.
Figure 3:
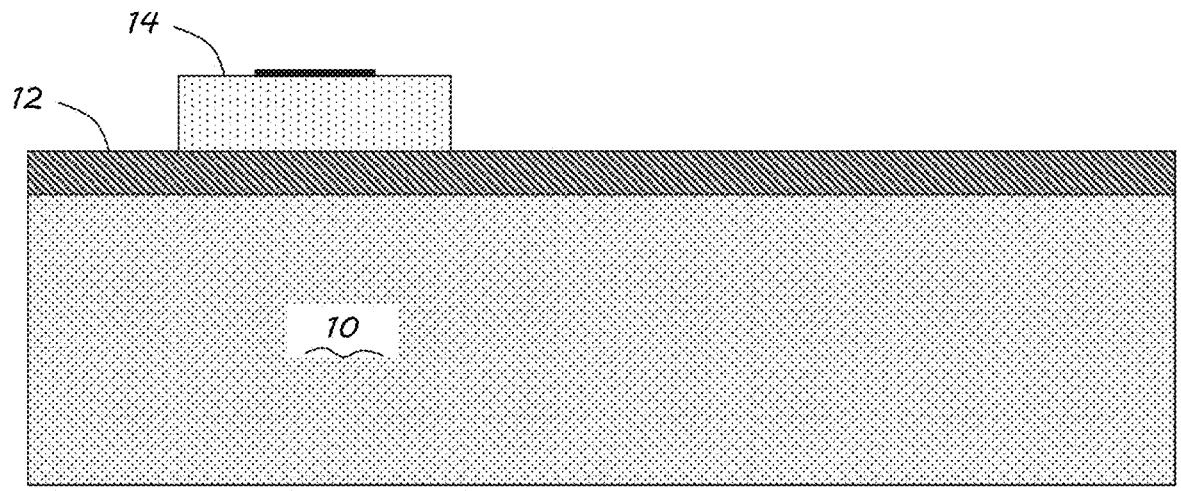
FIG. 3 is a representation of the substrate and active layer of FIG. 2 with native devices.

Turning now to the drawings, wherein like numbers denote like parts throughout the several views, FIG. 1 illustrates a substrate 10 onto which native and other components will placed. A material of substrate 10 is selected to have a thermal conductivity higher than non-native components that will be later flip chip mounted to the substrate 10. In an exemplary embodiment, the substrate 10 may be Silicon Carbide (SiC) or diamond with non-native components created on Gallium Oxide ($Ga_2O_3$). If the substrate 10 is not the active component for native components, then an active layer 12 composed of a semiconducting material may be deposited on substrate 10 as illustrated in FIG. 2. This semiconducting material may be selected from any eligible materials that would be appropriate for any native components created on the substrate 10. For example, the semiconducting material may include Gallium Nitride (GaN), Gallium Arsenide (GaAs), Gallium Phosphide (GaP), Zinc Oxide (ZnO), Indium Arsenide (InAs), Indium Gallium Arsenide (InGaAs), Indium Gallium Phosphide (InGaP), among others.

Figure 4A:
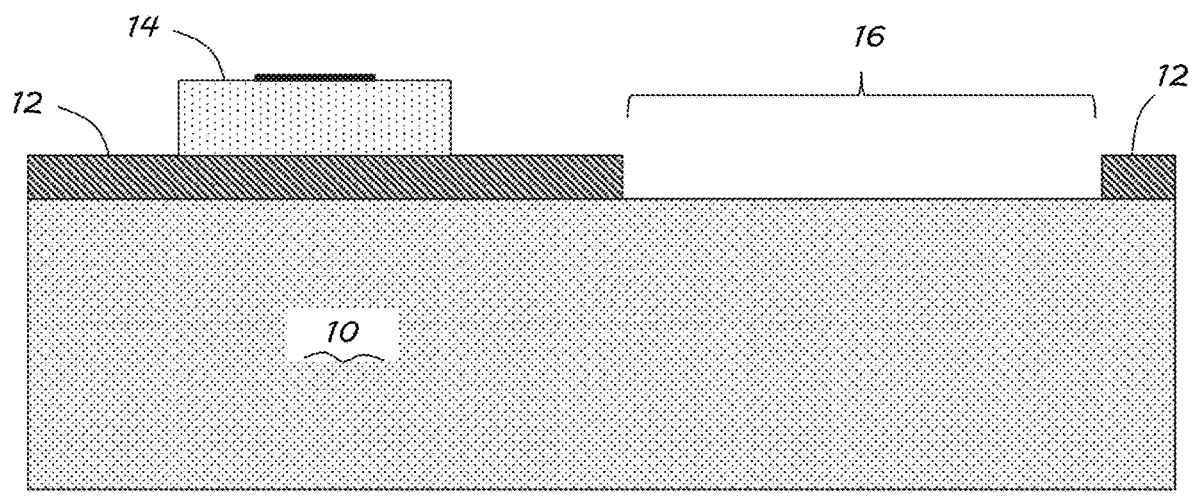
FIG. 4A is the substrate and active layer of FIG. 3 with a window etched through the active layer.
Figure 4B:
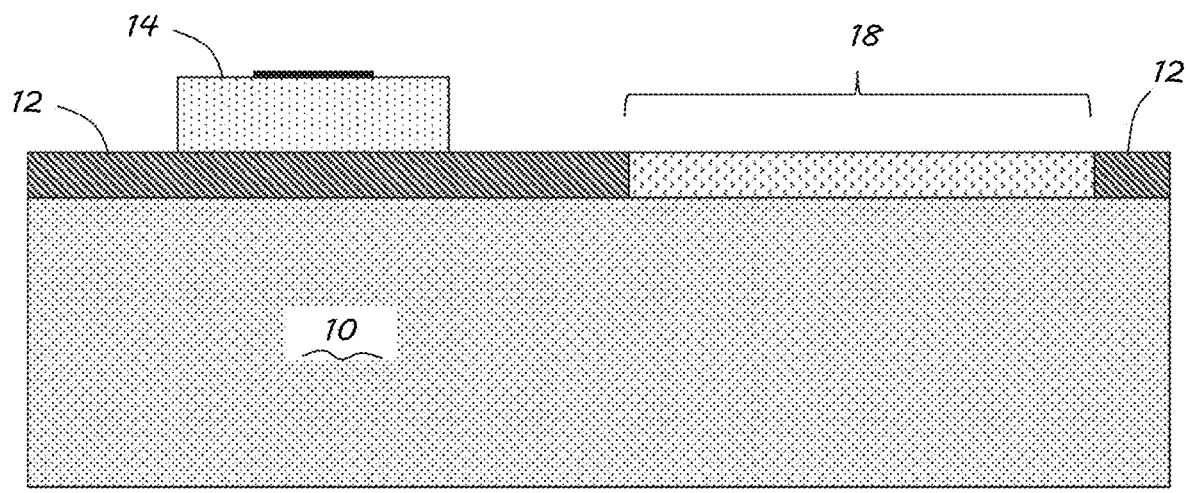
FIG. 4B is the substrate and active layer of FIG. 3 with an implanted region in the active layer.
Figure 4C:
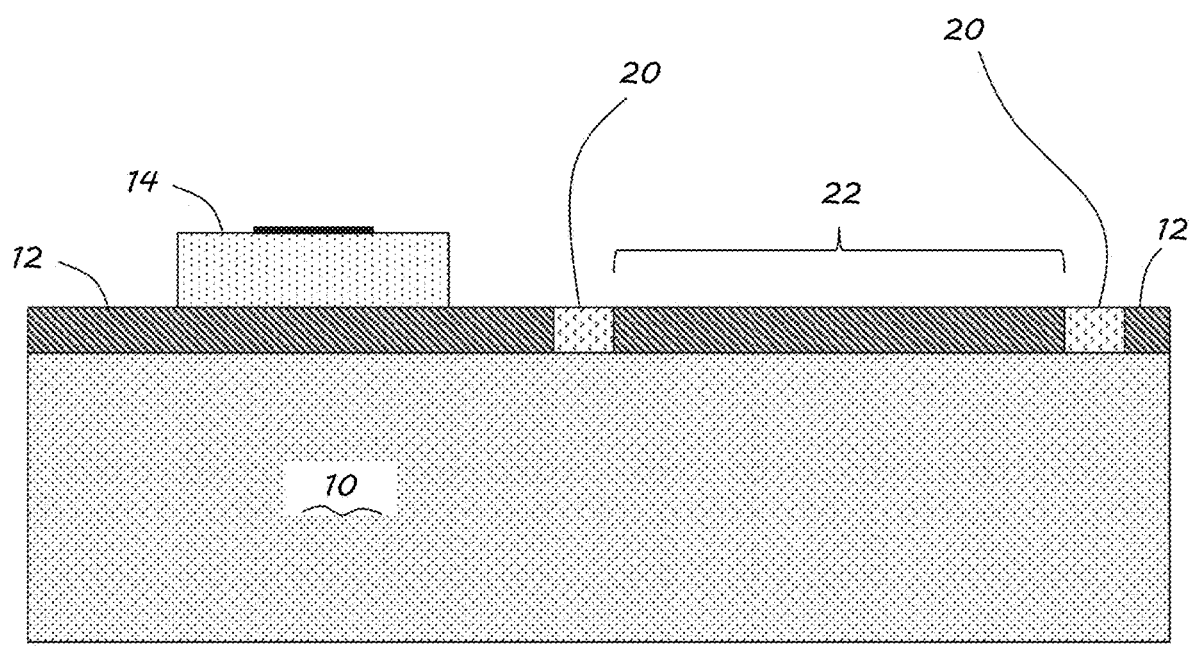
FIG. 4C is the substrate and active layer of FIG. 3 with implanted regions in the active layer to isolate a portion of the active layer.
Figure 4D:
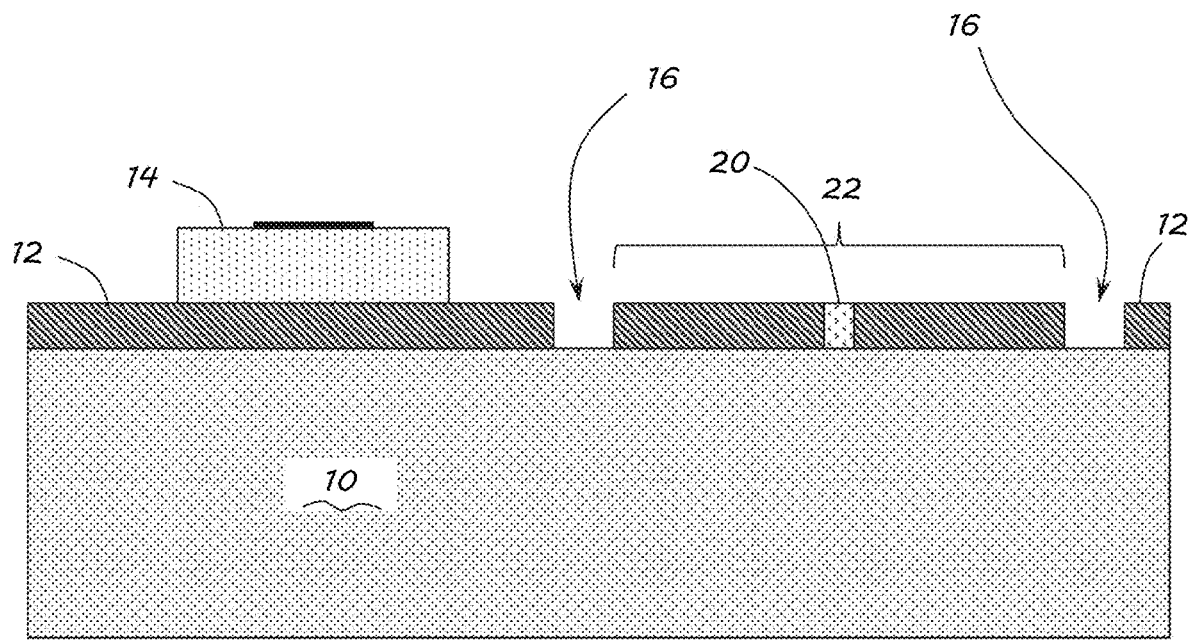
FIG. 4D is the substrate and active layer of FIG. 3 with both implanted and etched regions in the active layer to isolate a portion of the active layer.

With the active layer 12 deposited, native devices may then be created on the active layer 12 and substrate 10 using conventional methods, such as device 14. In the exemplary embodiment with a SiC substrate, the active layer 12 may be GaN for RF applications and device 14 may be, for example, an amplifier or other device. After all of the native devices, such as device 14, have been fabricated on the substrate 10, the substrate may be prepared for the mounting of the additional components. In some embodiments, this may be accomplish by etching one or more windows 16 through the active layer 12 to the substrate 10 as illustrated in FIG. 4A. Alternatively, instead of etching a window 16, an equivalent area may be implanted as illustrated in FIG. 4B forming an insulator or implantation may be used in specific areas 20 to isolate an area 22 from the native devices as illustrated in FIG. 4C. Additionally, a combination of implantation 20 and/or etching 16 of the active layer 12 may be used to form a mesa to isolate an area 22 from the native devices as illustrated in FIG. 4D. These areas may be formed using any number of conventional processes and may take any shape or even be patterned to match isolation areas and facilitate conduction areas for electrical connections to the additional components.

Figure 5:
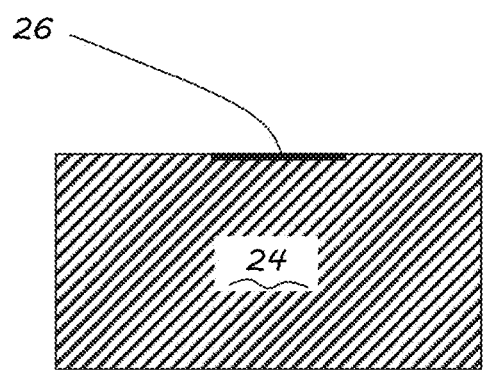
FIG. 5 is a representation of a device on a substrate with a lower thermal conductivity than the substrate in FIGS. 1-4D.
Figure 6:
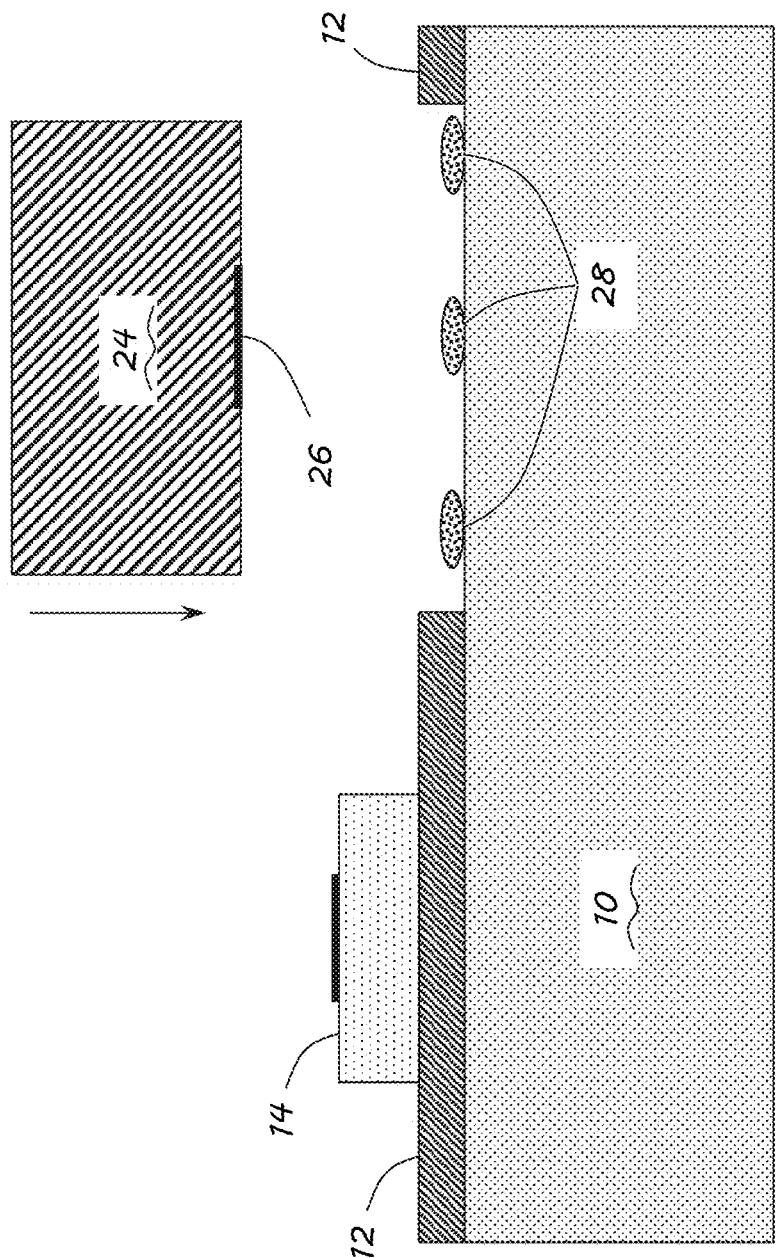
FIG. 6 illustrates flip chip mounting of the device in FIG. 5 in the window in FIG. 4A.
Figure 7:
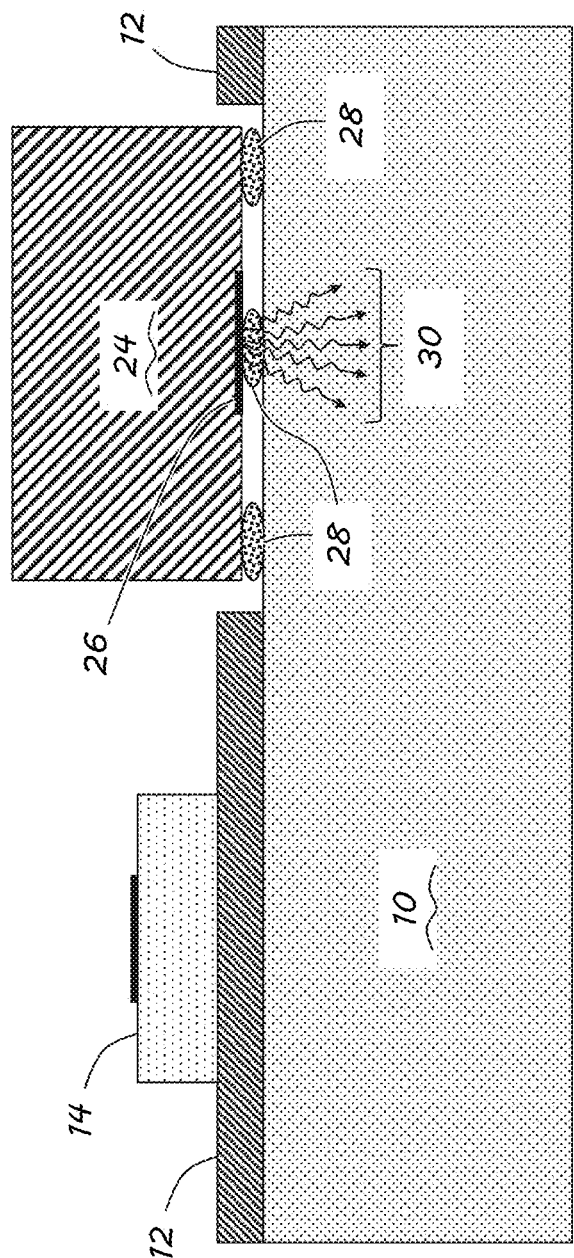
FIG. 7 illustrates shunting the heat generated by the device of FIG. 5 through the substrate of FIGS. 1-4D.

Once the substrate 10 has been prepared, other devices that have been fabricated on substrates/active layers that have lower thermal conductivity may be prepared, such as device 24, which has a heat generation area 26 as illustrated in FIG. 5. Devices, such as device 24 may be, for example, power conversion devices, switching devices, or RF or high impedance amplifiers, among others. Due to the low thermal conductivity of the substrate/active layer of these devices, generated heat does not dissipate and builds around the heat generation area 26 to excess temperatures hindering device operation. To remedy this, device 24 may be flip chip mounted onto the substrate 10 at either a windowed area 16 such as in FIG. 4A, or on an implanted insulting area 18 or isolated conducting area 22 in FIGS. 4B through 4D. The device 24 may be mounted via gold bumps 28 as seen in FIG. 6, for example, though other mounting methods, such as copper pillars, may also be used as long as the mounting material is both thermally and electrically conductive. Once mounted, the device 24 then shunts generated heat 30 through the gold bumps 28 and into substrate 10 as illustrated in FIG. 7, with the substrate acting as the heat sink for device 24. Additionally, these gold bump 28 (or other connections in other embodiments) serve as the electrical connections to the device 24. Thus, for the illustrated embodiment, the $Ga_2O_3$ based device 24 is flip bonded to the higher-thermal conductivity SiC substrate 10 to remove the heat through the contacts on the $Ga_2O_3$ device 24 surface since the heat generated cannot propagate out the backside of the $Ga_2O_3$ device 24. Multiple alternative configurations may exist for other embodiments. For example, both vertical and lateral device topologies may be fabricated on $Ga_2O_3$ because $Ga_2O_3$ substrates may be both insulating and conducting. The vertical configurations may include a high-voltage contact where a high-voltage input may be applied directly to the $Ga_2O_3$ wafer and then down converted to the required GaN voltages. In the later configuration, all inputs may reside directly on the SiC substrate.

Figure 8:
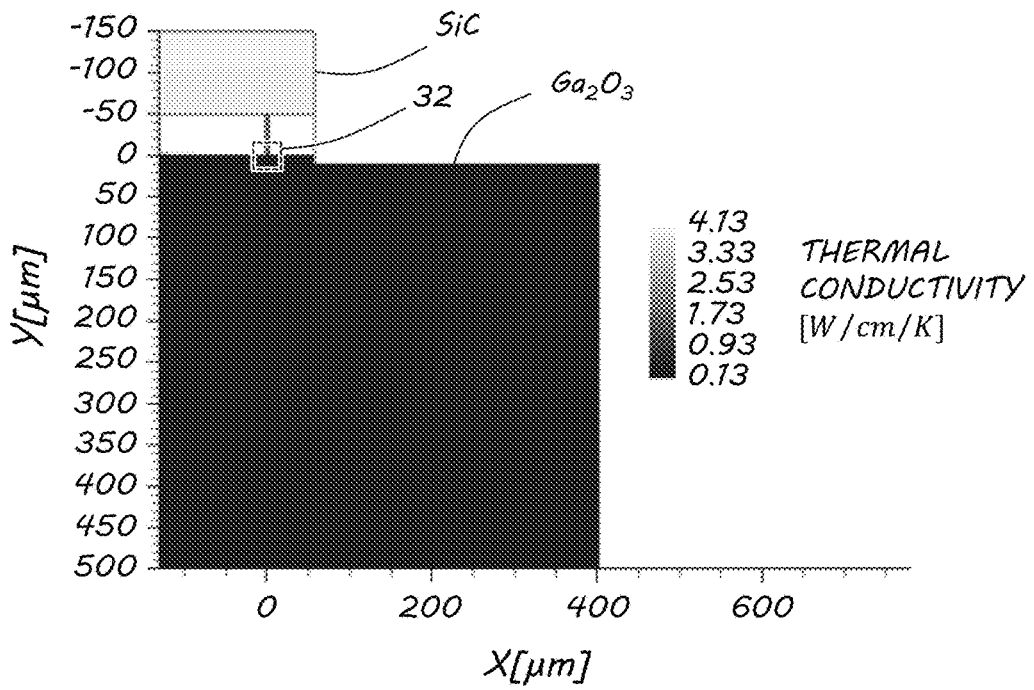
FIG. 8 is a diagram illustrating thermal conductivity of a device similar to that in FIG. 5.
Figure 8A:
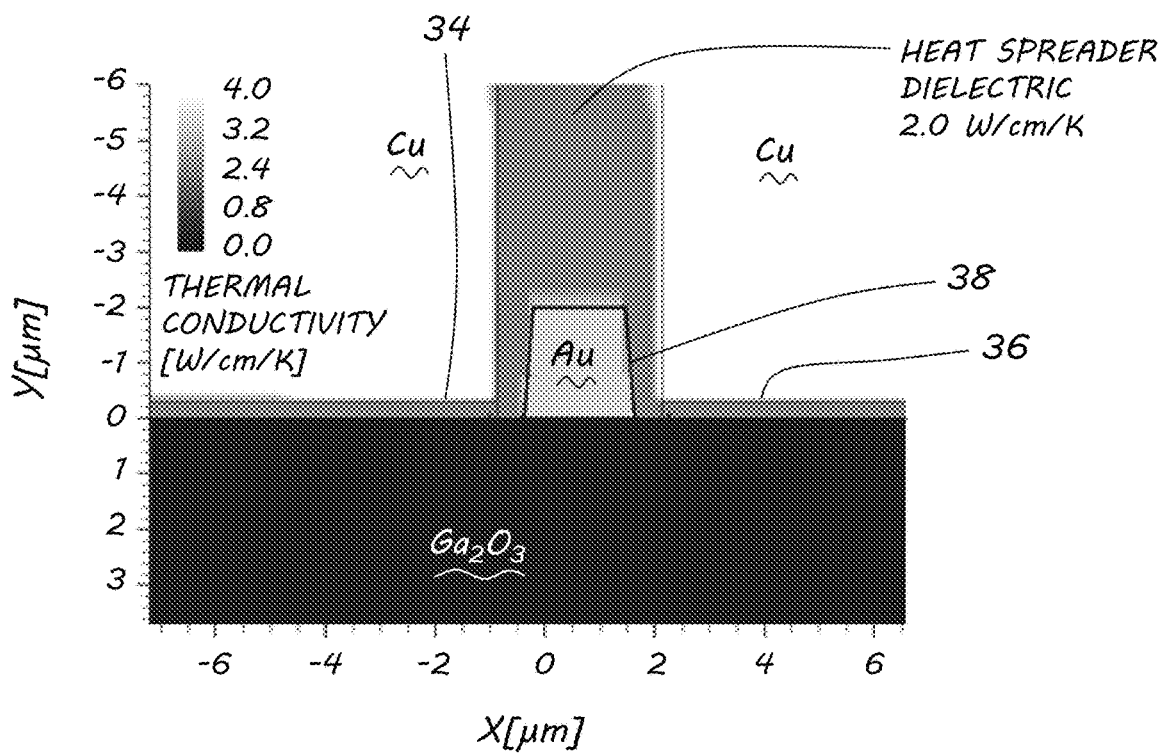
FIG. 8A is a zoomed portion of FIG. 8.
Figure 9:
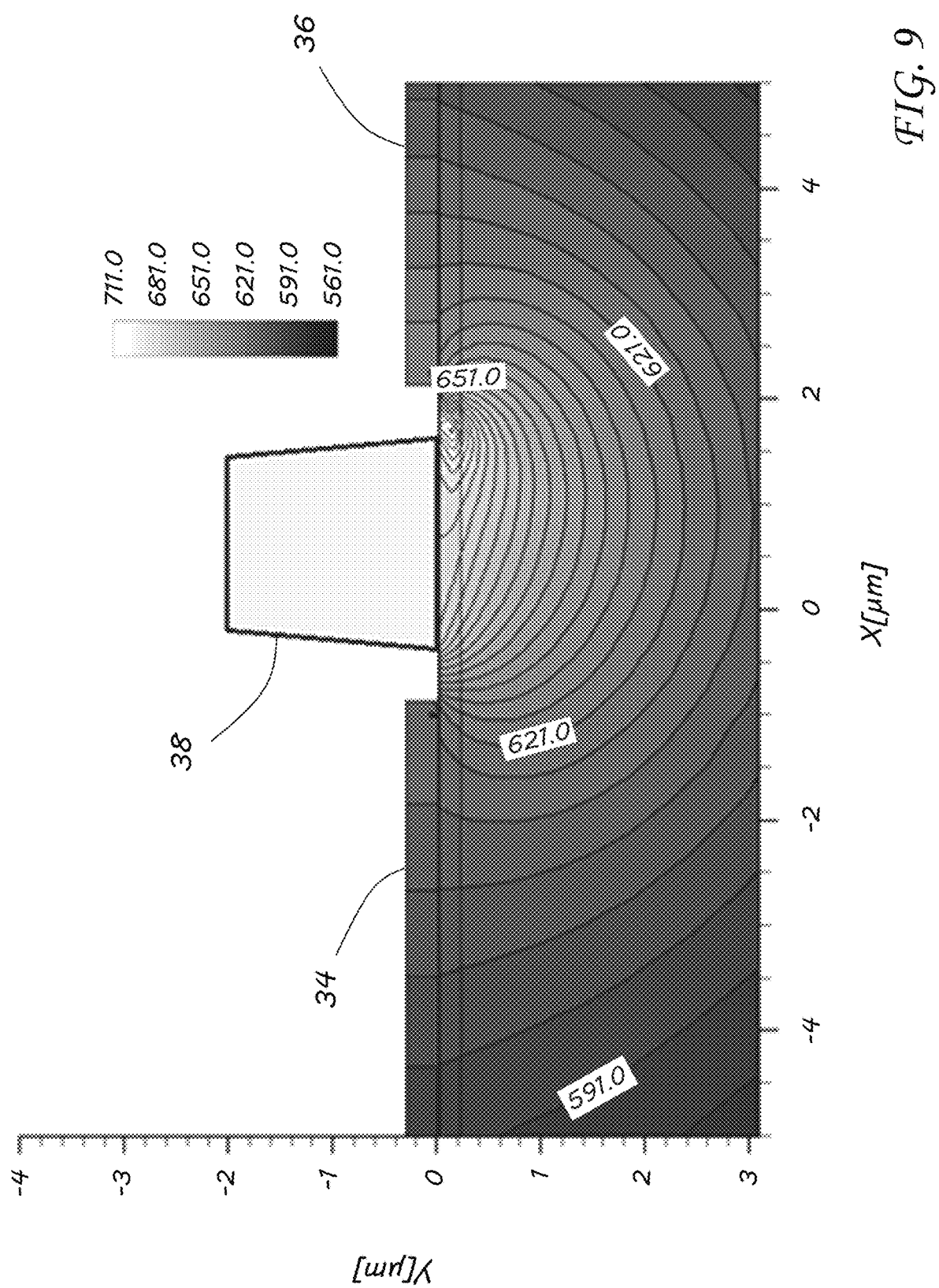
FIG. 9 is a temperature plot of the zoomed portion in FIG. 8A without shunting heat through a substrate.
Figure 10:
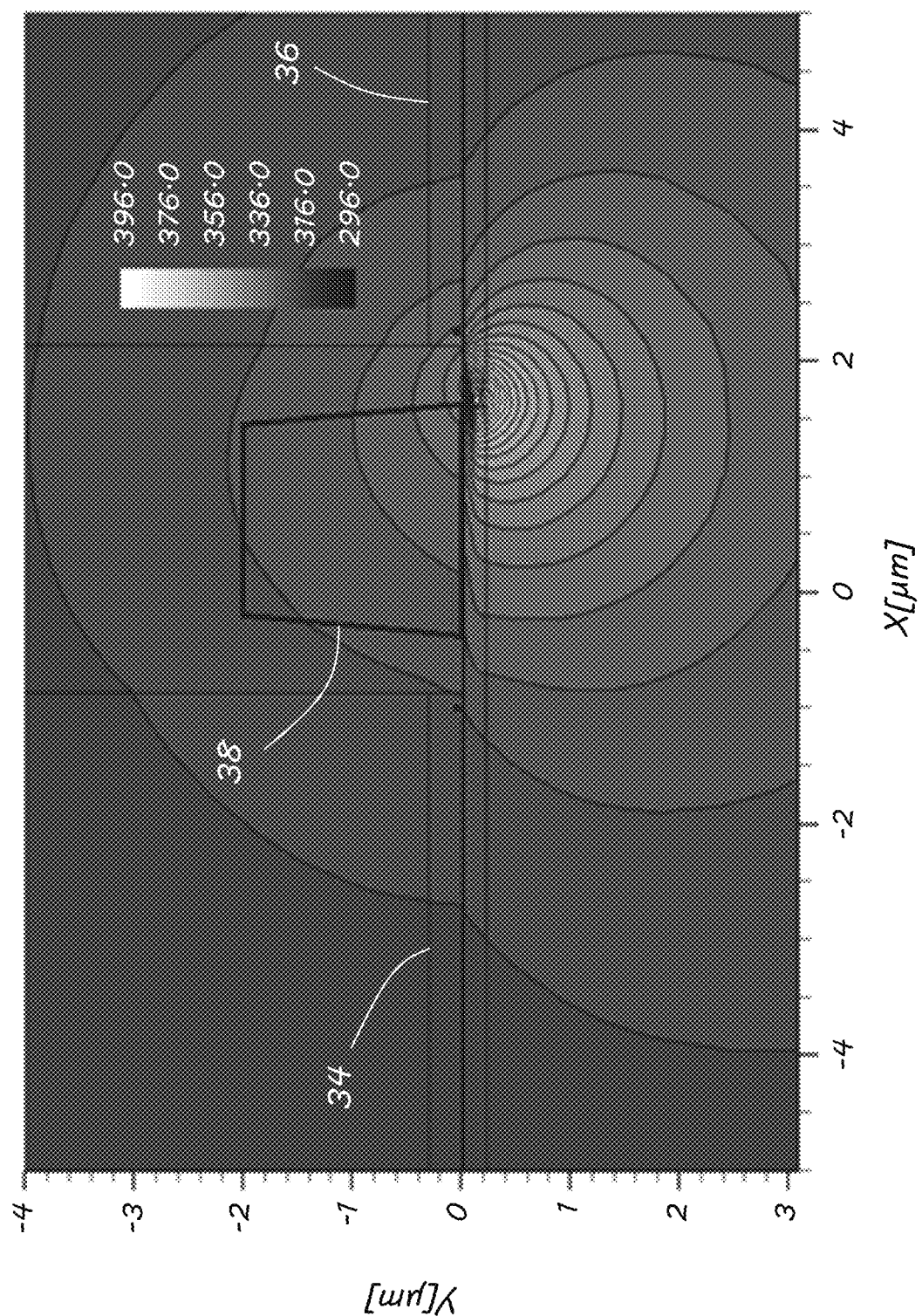
FIG. 10 is a temperature plot of the zoomed portion in FIG. 8A with shunting of heat through the substrate.

FIGS. 8 and 8A are graphs illustrating the thermal conductivities of the components of a copper pillar bonded $Ga_2O_3$ chiplet bonded to SiC substrate. In this exemplary embodiment, the bonds are to the source 34 and drain 36, however, the chip may be bonded by the gate electrode 38 or any permutation of electrodes as needed to sink the heat. FIG. 8 illustrates the thermal conductivities of the $Ga_2O_3$ based device mounted to SiC. FIG. 8A is a zoomed portion of FIG. 8 in the area indicated by the dotted lined box 32. In FIG. 8A, the copper pillar bonds mount to the source and drain and may be seen along with the gold gate electrode and the $Ga_2O_3$ substrate. As can be seen in both figures, $Ga_2O_3$ has the lowest thermal conductivity. This configuration was analyzed for both a case where the generated heat was allowed to build in the device (FIG. 9), as well as removing the heat from the $Ga_2O_3$ device through a SiC substrate (FIG. 10). As can be seen in FIG. 9, the heat builds locally near the gate electrode and peaks at a temperature of 711 K with very little heat propagating back through the $Ga_2O_3$. In contrast, as seen in FIG. 10, the heat peaks at a temperature of 396 K and can be seen to propagate away from the hot spot through the electrical connections toward the SiC substrate 10.

Using the flip chip mounting and shunting generated heat through a substrate with a higher thermal conductivity, as illustrated above with respect to embodiments of the invention, enables point of use power conversion to be a real possibility with semiconducting materials like $Ga_2O_3$. Because the dynamic switching losses are so low, it is anticipated that the device would be able to switch as much as 50 to 100 times faster than state of the art. In turn, the passive components scale by the same factor.

Figure 11:
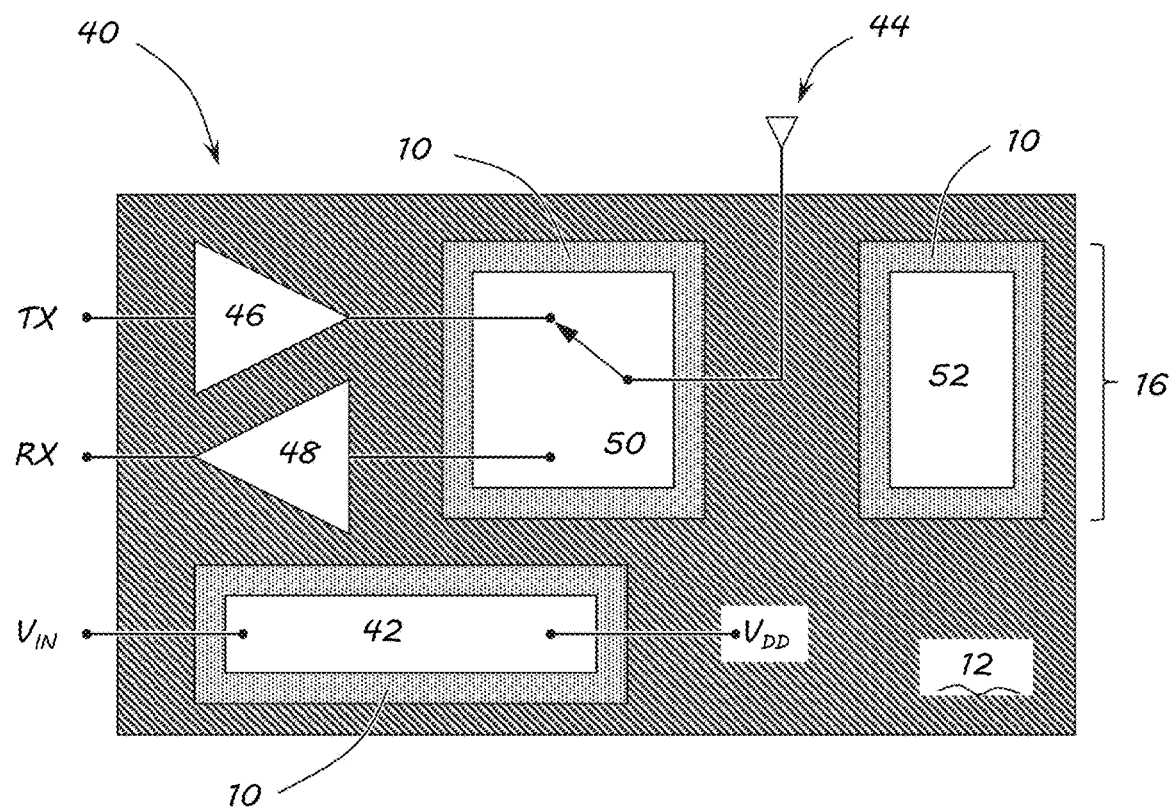
FIG. 11 is a functional block diagram using embodiments of the invention for an exemplary RF application.
Figure 11A:
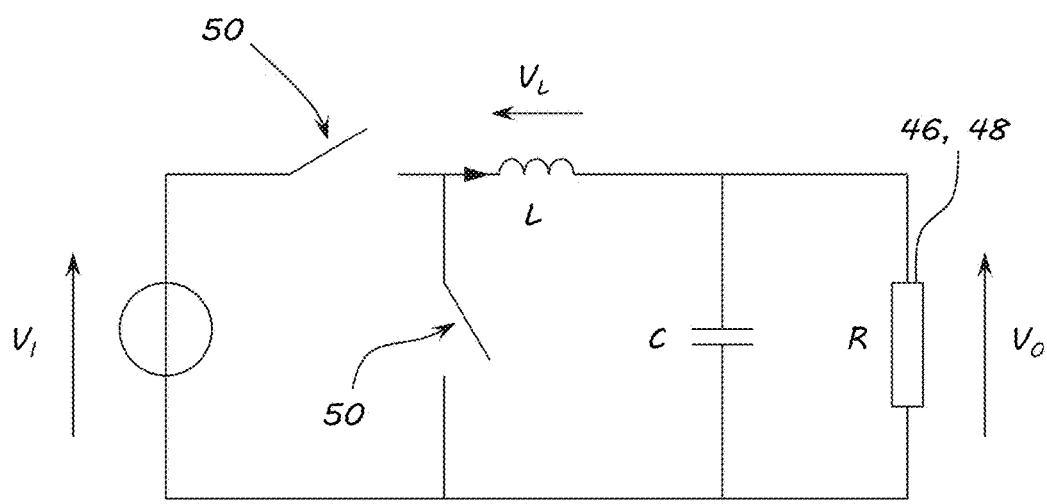
FIG. 11A is an equivalent circuit corresponding to the functional block diagram of FIG. 11.

FIG. 11 illustrates a simple functional block diagram example of a buck converter example integrated into an RF application using $Ga_2O_3$ applications for power conversion, RF switches, and high voltage RF amplifiers. FIG. 11A is a simple schematic corresponding to the functional block diagram in FIG. 11. These power conversion and RF elements may be integrated into any high performance RF material host with good thermal conductivity, such as GaN and SiC as illustrated with embodiments of the invention above. In this exemplary embodiment, high voltages may be applied directly to a chip 40 at $V_{in}$, which for some embodiments, may be hundreds of volts to kilovolts or even higher. The on chip power conversion 42 based on $Ga_2O_3$ down converts the high voltage to chip level $V_{DD}$ for RF or digital applications (5V, 28V, 48V, etc.). In other applications, this may also be a boost from low to high voltages. RF signals may be transmitted and received via antenna 44 through the TX and RX connections to chip 40. Transmitted signals may pass through an on chip power amplifier 46 and received signals may be passed through an on chip low noise amplifier 48. Both the amplifiers 46, 48 may be switched through HP RF switch 50 integrated on chip 40. Additional HV and RF and high impedance amplifiers 52 may also be used with other on chip native components.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An integrated circuit, comprising:
a first substrate with a first thermal conductivity;
an active layer deposited on the first substrate;
a first window formed in the active layer and exposing a portion of the first substrate forming a first and a second region of the active layer;
at least one native device fabricated on the first region of the active layer;
a first insulating region formed in the second region of the active layer via implantation; and
a non-native device fabricated in a second substrate with a second thermal conductivity lower than the first thermal conductivity,
wherein the non-native device is mounted on the second region of the active layer using a flip-chip mount and electrically connected to the at least one native device,
wherein the non-native device adds circuit or electrical functionality to the first substrate, and
wherein the non-native device is thermally connected to the first substrate such that heat generated by the non-native device is removed through the second region of the active layer and the first substrate.

2. The integrated circuit of claim 1, wherein the first insulating region divides the second region of the active layer into a third and fourth region of the active layer, and wherein the non-native device is mounted using the flip-chip mount such that at least one of a first electrode of the non-native device is electrically connected to the third region of the active layer and a second electrode of the non-native device is electrically connected to the fourth region of the active layer.

3. The integrated circuit of claim 2, wherein the first insulating region electrically isolates the third region of the active layer.

4. The integrated circuit of claim 1, wherein the first substrate is selected from a group of materials consisting of silicon carbide (SiC) and diamond.

5. The integrated circuit of claim 1, wherein the second substrate is a gallium oxide ($Ga_2O_3$) material.

6. The integrated circuit of claim 1, wherein the active layer is selected from a group of materials consisting of gallium nitride (GaN), gallium arsenide (GaAs), gallium phosphide (GaP), zinc oxide (ZnO), indium arsenide (InAs), indium gallium arsenide (InGaAs), and indium gallium phosphide (InGaP).

7. The integrated circuit of claim 1, wherein the non-native device is mounted using gold bump bonds for the flip-chip mount.

8. The integrated circuit of claim 1, wherein the non-native device is mounted using copper pillar bonds for the flip-chip mount.

9. An integrated circuit, comprising:
a first substrate with a first thermal conductivity;
an active layer deposited on the first substrate,
at least one native device fabricated on the active layer;
a first window formed in the active layer and exposing a portion of the first substrate, the first window electrically isolating a first isolated conduction region of the active layer; and
a non-native device fabricated in a second substrate with a second thermal conductivity lower than the first thermal conductivity,
wherein the non-native device adds circuit or electrical functionality to the first substrate,
wherein the non-native device is mounted using a flip-chip mount such that at least one electrode of the non-native device is electrically connected to the first isolated conducting region and the non-native device is further electrically connected to the at least one native device, and
wherein the non-native device is thermally connected to the first substrate such that heat generated by the non-native device is removed through the first substrate.

10. The integrated circuit of claim 9, further comprising:
a second window formed in the active layer and exposing a portion of the first substrate,
wherein the first and second windows electrically isolate the first isolated conduction region of the active layer.

11. The integrated circuit of claim 9, wherein the first substrate is selected from a group of materials consisting of silicon carbide (SiC) and diamond.

12. The integrated circuit of claim 9, wherein the second substrate is a gallium oxide ($Ga_2O_3$) material.

13. The integrated circuit of claim 9, wherein the active layer is selected from a group of materials consisting of gallium nitride (GaN), gallium arsenide (GaAs), gallium phosphide (GaP), zinc oxide (ZnO), indium arsenide (InAs), indium gallium arsenide (InGaAs), and indium gallium phosphide (InGaP).

14. The integrated circuit of claim 9, wherein the non-native device is mounted using gold bump bonds or copper pillar bonds for the flip-chip mount.

15. An integrated circuit, comprising:
a first substrate with a first thermal conductivity;
an active layer deposited on the first substrate;
a first insulating region formed in the active layer via implantation forming a first and a second region of the active layer;
at least one native device fabricated on the first region of the active layer;
a first window formed in the second region of the active layer and exposing a portion of the first substrate; and
a non-native device fabricated on a second substrate with a second thermal conductivity lower than the first thermal conductivity,
wherein the non-native device is mounted using a flip-chip mount on the second region of the active layer and electrically connected to the at least one native device,
wherein the non-native device adds circuit or electrical functionality to the first substrate, and
wherein the non-native device is thermally connected to the first substrate such that heat generated by the non-native device is removed through the second region of the active layer and the first substrate.

16. The integrated circuit of claim 15, wherein the first window divides the second region of the active layer into a third and fourth region of the active layer, and wherein the non-native device is mounted using the flip-chip mount such that at least one of a first electrode of the non-native device is electrically connected to the third region of the active layer and a second electrode of the non-native device is electrically connected to the fourth region of the active layer.

17. The integrated circuit of claim 16, wherein the first window electrically isolates the third region of the active layer.

18. The integrated circuit of claim 15, wherein the first substrate is selected from a group of materials consisting of silicon carbide (SiC) and diamond.

19. The integrated circuit of claim 15, wherein the second substrate is a gallium oxide ($Ga_2O_3$) material.

20. The integrated circuit of claim 15, wherein the active layer is selected from a group of materials consisting of gallium nitride (GaN), gallium arsenide (GaAs), gallium phosphide (GaP), zinc oxide (ZnO), indium arsenide (InAs), indium gallium arsenide (InGaAs), and indium gallium phosphide (InGaP).

* * * * *